United States Patent
Chang et al.

(10) Patent No.: US 12,362,252 B2
(45) Date of Patent: Jul. 15, 2025

(54) METHOD FOR MANUFACTURING COMPOSITE LAYER CIRCUIT STRUCTURE OF ELECTRONIC DEVICE

(71) Applicant: Innolux Corporation, Miao-Li County (TW)

(72) Inventors: Yu-Jen Chang, Miao-Li County (TW); Ching-Wei Chen, Miao-Li County (TW); Tzu-Yen Chiu, Miao-Li County (TW); Hung-I Tseng, Miao-Li County (TW); Chun-Chin Fan, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 485 days.

(21) Appl. No.: 17/751,653

(22) Filed: May 23, 2022

(65) Prior Publication Data
US 2023/0178447 A1    Jun. 8, 2023

(30) Foreign Application Priority Data
Dec. 2, 2021    (CN) .......................... 202111476716.5

(51) Int. Cl.
*H01L 23/31* (2006.01)
*H01L 21/02* (2006.01)
*H01L 21/768* (2006.01)

(52) U.S. Cl.
CPC .... *H01L 23/3192* (2013.01); *H01L 21/02271* (2013.01); *H01L 21/76873* (2013.01); *H01L 2924/14* (2013.01); *H01L 2924/181* (2013.01)

(58) Field of Classification Search
None
See application file for complete search history.

(56) References Cited

U.S. PATENT DOCUMENTS 7,205,660 B2    4/2007   Park et al.
2012/0273964 A1*  11/2012  Kanki ..................... H01L 24/20
                                                257/E21.705

(Continued)

FOREIGN PATENT DOCUMENTS

| TW | 200945974 | 11/2009 |
|----|-----------|---------|
| TW | 202043035 | 12/2020 |

OTHER PUBLICATIONS

"Office Action of Taiwan Counterpart Application", issued on May 17, 2023, pp. 1-4.

*Primary Examiner* — Khaja Ahmad
(74) *Attorney, Agent, or Firm* — JCIPRNET

(57) ABSTRACT

A method for manufacturing a composite layer circuit structure of an electronic device is provided. First, a first conductive layer is formed on a carrier plate. Next, a first photoresist layer is formed on the first conductive layer. The first photoresist layer includes multiple first openings exposing part of the first conductive layer. Next, a first electroplating layer is formed in the first openings. Then, the first photoresist layer is removed. Then, a first insulating layer is formed on the first conductive layer. The first insulating layer includes multiple second openings exposing part of the first electroplating layer. In the above, at least one heat treatment process is performed on the first electroplating layer before the first insulating layer is formed on the first conductive layer. A temperature when performing at least one heat treatment process is higher than or equal to 40° C. and lower than or equal to 300° C.

18 Claims, 12 Drawing Sheets

(56) References Cited

U.S. PATENT DOCUMENTS

| | | | | |
|---|---|---|---|---|
| 2014/0239439 A1* | 8/2014 | Hogle | ............... | H01L 23/53238 |
| | | | | 257/529 |
| 2014/0251676 A1* | 9/2014 | Kurafuchi | ............ | H05K 3/4697 |
| | | | | 174/268 |
| 2014/0308811 A1* | 10/2014 | Sasajima | ........... | H01L 23/53238 |
| | | | | 438/660 |
| 2017/0338128 A1* | 11/2017 | Huang | ............... | H01L 23/49816 |
| 2019/0259631 A1* | 8/2019 | May | ....................... | H05K 3/423 |
| 2022/0352086 A1* | 11/2022 | Yu | ..................... | H01L 23/49827 |

* cited by examiner

METHOD FOR MANUFACTURING COMPOSITE LAYER CIRCUIT STRUCTURE OF ELECTRONIC DEVICE

CROSS-REFERENCE TO RELATED APPLICATION

This application claims the priority benefit of China application serial no. 202111476716.5, filed on Dec. 2, 2021. The entirety of the above-mentioned patent application is hereby incorporated by reference herein and made a part of this specification.

BACKGROUND

Technical Field

The disclosure relates to a method for manufacturing an electronic device, and more particularly, to a method for manufacturing a composite layer circuit structure of an electronic device.

Description of Related Art

Electronic devices conduct electricity or transmit signals through the conductive layer, so the quality of the conductive layer is critical to the reliability of the electronic device. For example, in a panel-level packaging, the physical properties of the conductive layer are critical to the reliability and electrical properties of the circuit structure. For instance, due to uneven internal stress, the circuit structure may become warped or may suffer from pinhole defects, or the manufactured circuit structure is deformed after being bonded to other electronic components. These defects will easily lead to short circuits of the circuit structure and/or abnormal signal transmission, making the manufactured circuit structure less reliable and less electrically stable.

SUMMARY

The disclosure provides a method for manufacturing a composite layer circuit structure of an electronic device, and the manufactured composite layer circuit structure has improved reliability and/or electrical properties.

The method for manufacturing a composite layer circuit structure provided according to an embodiment of the disclosure includes following steps. First, a first conductive layer is formed on a carrier plate. Next, a first photoresist layer is formed on the first conductive layer, in which the first photoresist layer includes a plurality of first openings exposing part of the first conductive layer. Next, a first electroplating layer is formed in the plurality of first openings. Then, the first photoresist layer is removed. After that, a first insulating layer is formed on the first conductive layer, in which the first insulating layer includes a plurality of second openings exposing part of the first electroplating layer. In the above steps, at least one heat treatment process is performed on the first electroplating layer before the first insulating layer is formed on the first conductive layer, in which a temperature when performing the at least one heat treatment process is higher than or equal to 40° C. and lower than or equal to 300° C., and a time when performing the at least one heat treatment process is less than or equal to 1 hour.

In order to make the above-mentioned features and advantages of the disclosure more obvious and easy to understand, the following embodiments are given and described in detail with reference to the accompanying drawings as follows.

BRIEF DESCRIPTION OF THE DRAWINGS

The accompanying drawings are included to provide a further understanding of the disclosure, and are incorporated in and constitute a part of the disclosure. The drawings illustrate embodiments of the disclosure and, together with the description, serve to explain the principles of the disclosure.

DESCRIPTION OF THE EMBODIMENTS

Figure 1A:
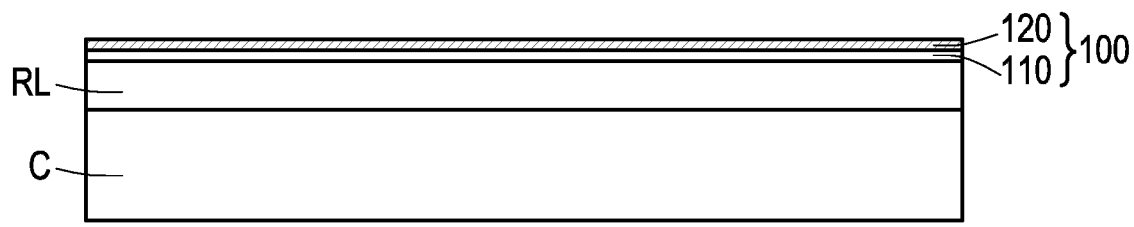
FIGS. 1A to 1M are partial cross-sectional schematic diagrams of a method for manufacturing a composite layer circuit structure according to a first embodiment of the disclosure.
Figure 1B:
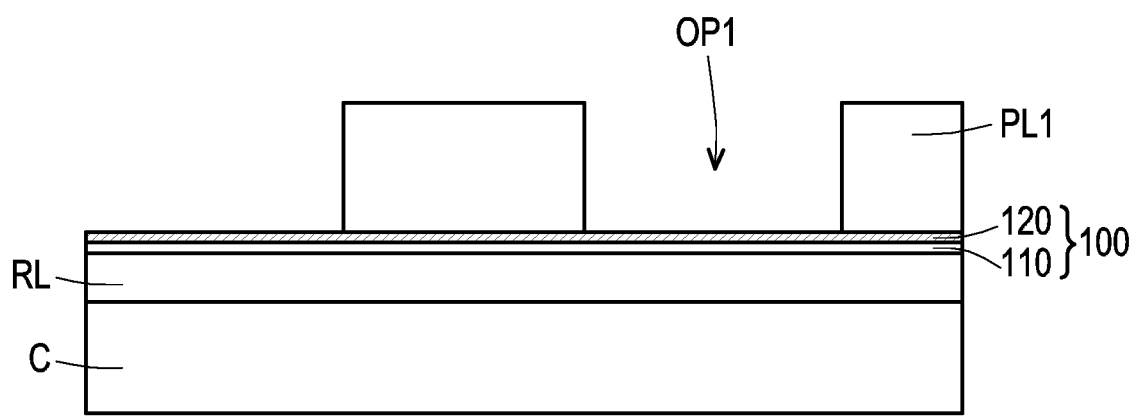
Figure 1C:
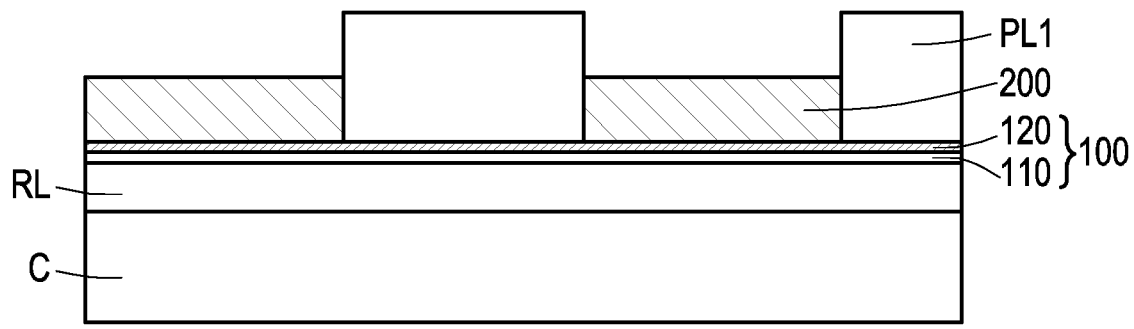
Figure 1D:
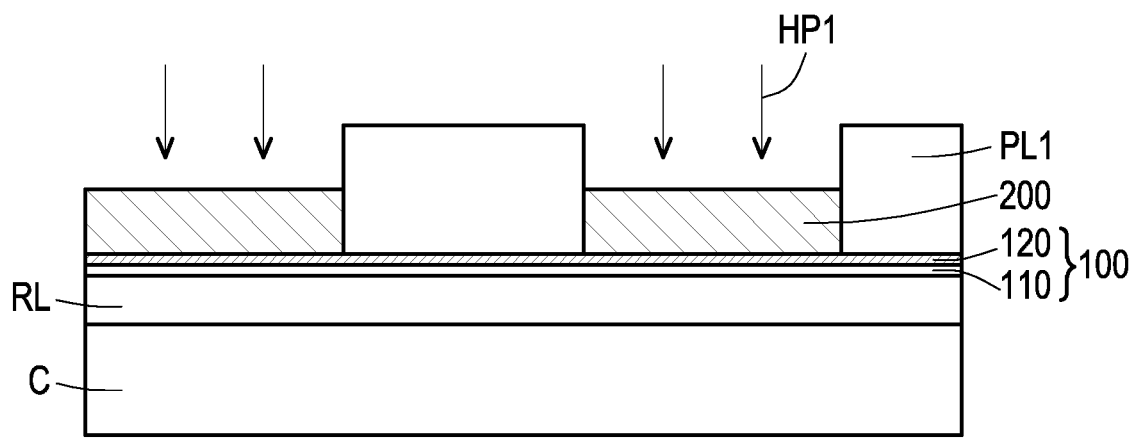
Figure 1E:
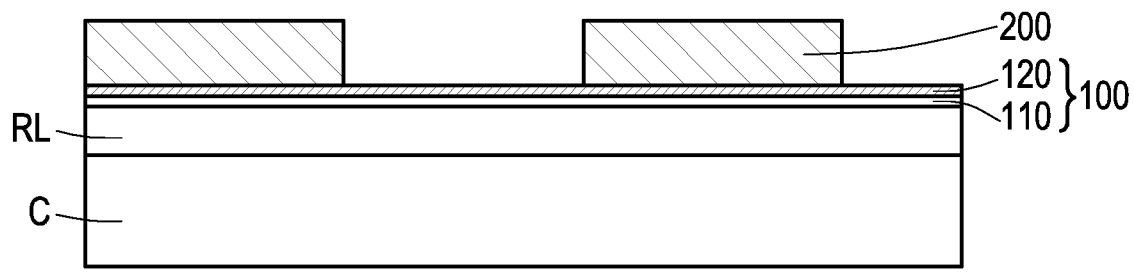
Figure 1F:
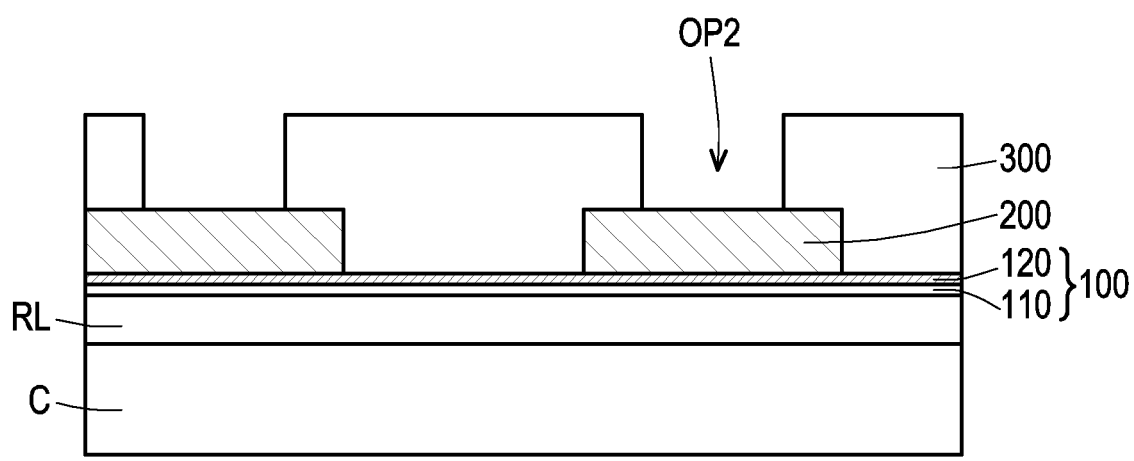
Figure 1G:
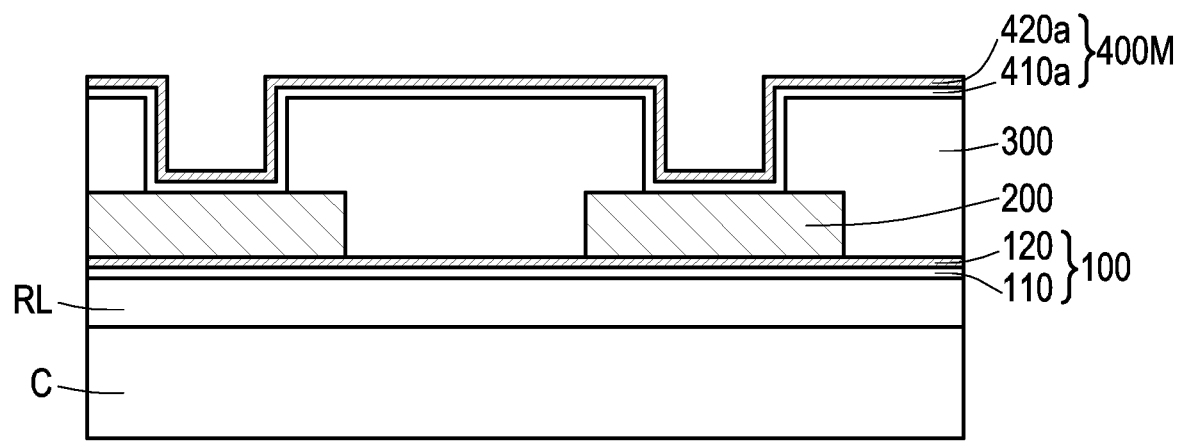
Figure 1H:
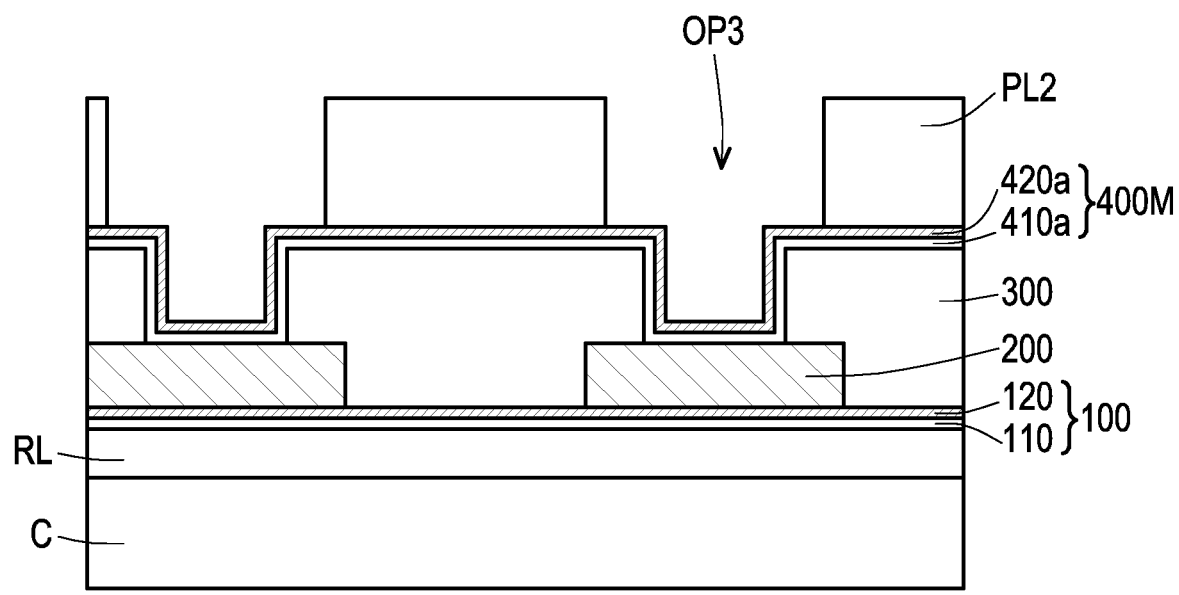
Figure 1I:
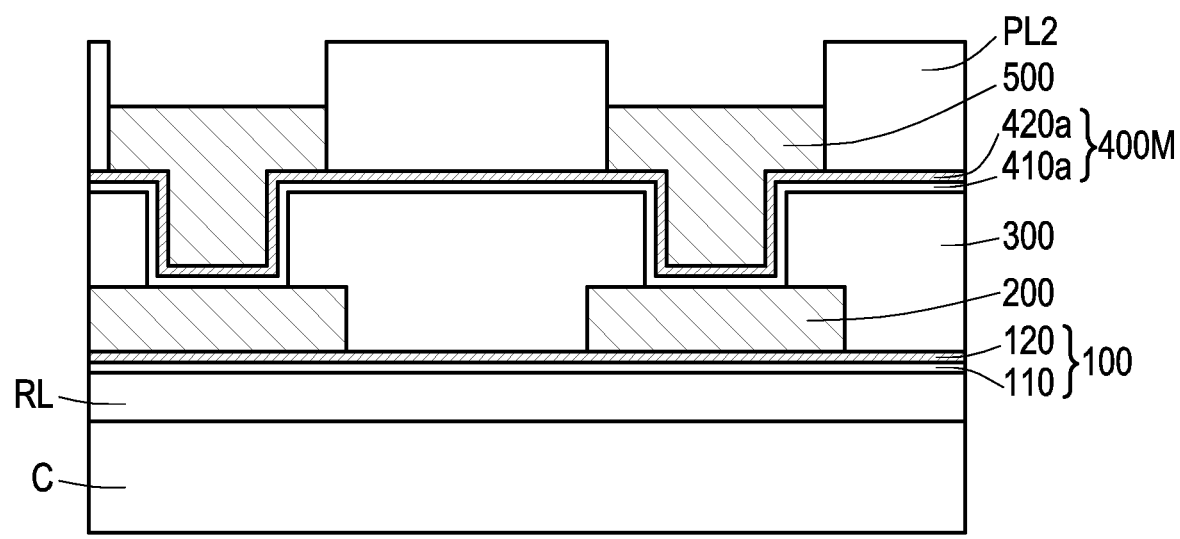
Figure 1J:
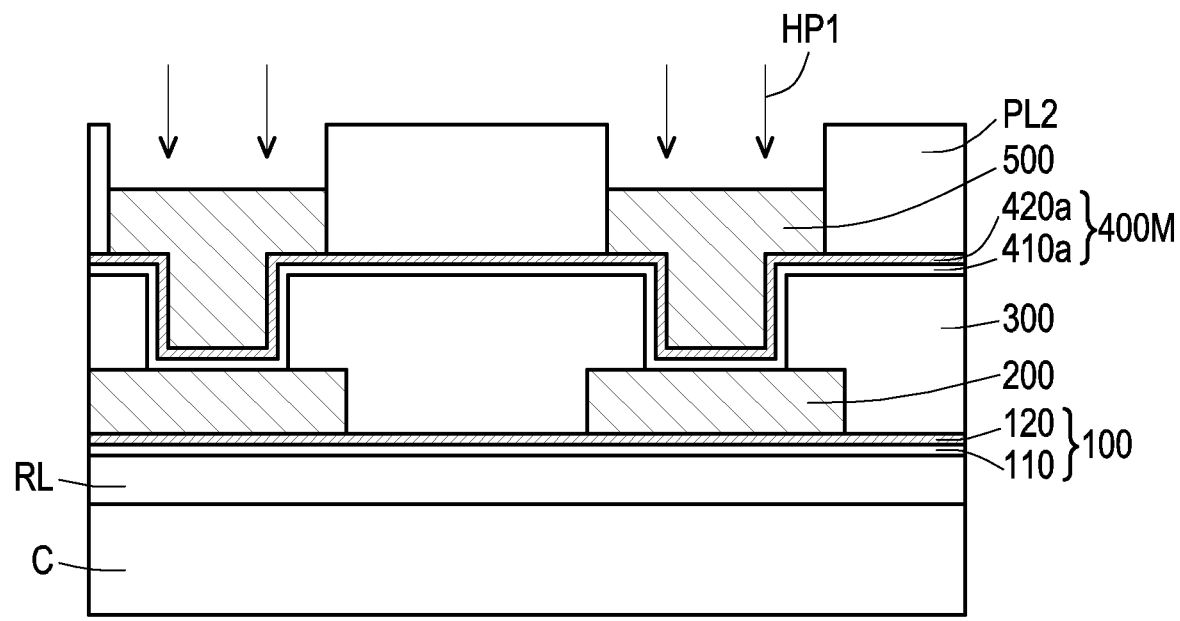
Figure 1K:
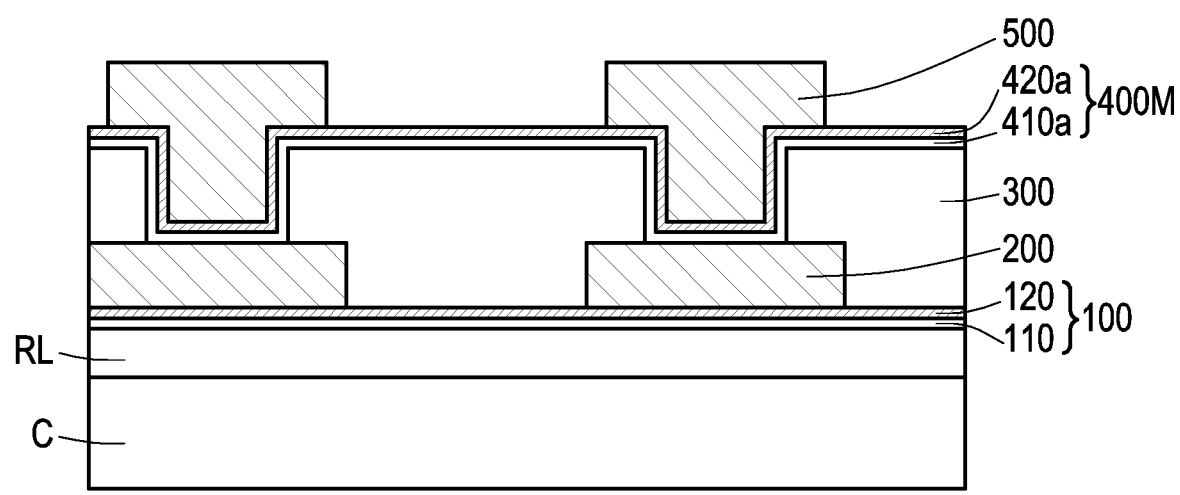
Figure 1L:
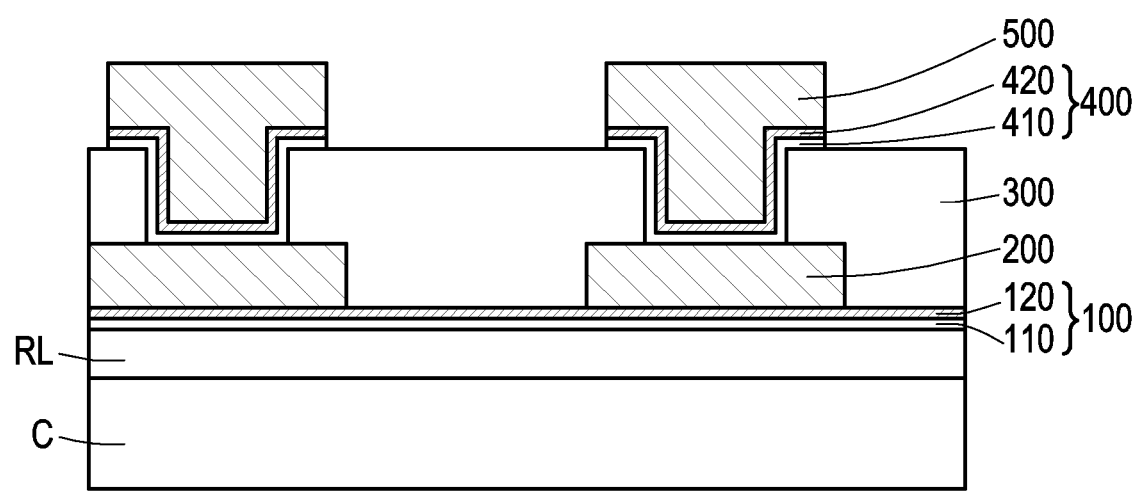
Figure 1M:
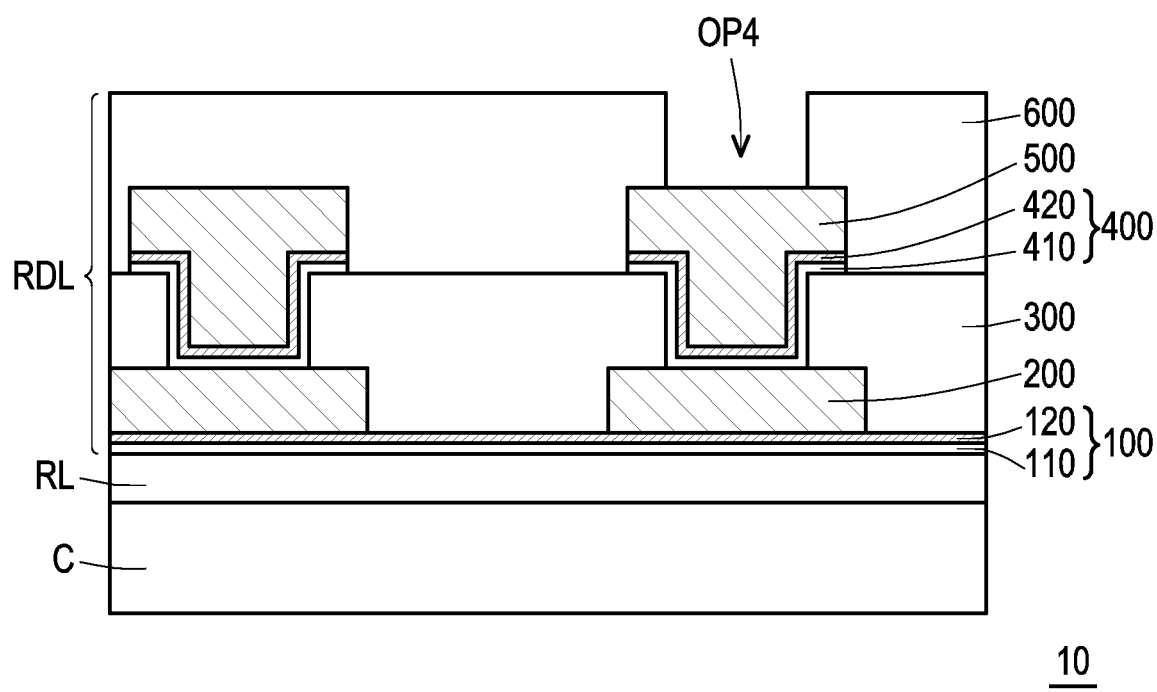

The disclosure can be understood by referring to the following detailed description in conjunction with the accompanying drawings. Note that in order to facilitate the reader's understanding and the simplicity of the drawings, only a part of the electronic device is drawn in the multiple diagrams in the disclosure. Moreover, the specific components in the drawings are not drawn according to actual scale. In addition, the number and size of each component in the drawings are only for illustration, and are not used to limit the scope of the disclosure.

Certain terms are used throughout the specification and appended claims of the disclosure to refer to specific components. Those skilled in the art should understand that electronic device manufacturers may refer to the same components by different names. The disclosure does not intend to distinguish between components that have the same function but different names. In the following specification and claims, terms such as "including", "containing", and "having" are open-ended terms, so should be interpreted as meaning "including but not limited to . . . ." Therefore, when the terms "including", "containing" and/or "having" are used in the description of the disclosure, these terms specify the existence of corresponding features, regions, steps, operations and/or components, but do not exclude the existence of one or more corresponding features, regions, steps, operations and/or components.

The directional terms mentioned in the disclosure, for example: "upper", "lower", "front", "rear", "left", "right" and so on are only directions with reference to the accompanying drawings. Therefore, the directional terms used are for illustration, but not to limit the disclosure. In the drawings, each drawing shows the general features of the methods, structures and/or materials adopted in specific embodiments, but should not be construed as defining or limiting the scope or nature covered by the embodiments. For example, for clarity, the relative size, thickness, and position of each layer, region, and/or structure may be reduced or enlarged.

When a corresponding component (such as a film layer or a region) is referred to as being "on another component", it may be directly on the other component, or there may be other components between the two. On the other hand, when a component is referred to as being "directly on another component", there is no component between the two. In addition, when a component is referred to as being "on another component", the two have a vertical relationship in the top view direction, the component may be above or below the other component, and the vertical relationship depends on the orientation of the device.

The terms "about", "substantially" or "approximately" are generally interpreted as being within 20% of a given value or range, or interpreted as being within 10%, within 5%, within 3%, within 2%, within 1%, within 0.5% or less of a given value or range.

The ordinal numbers used in the specification and claims, such as the terms "first", "second" and the like, to qualify a component do not imply or represent that the component or components are preceded with any ordinal numbers, nor do they represent the order of a certain component and another component, or the order in the manufacturing method, and are used only so as to clearly distinguish a component with one name from another component with the same name. Different terms may be used in the claims and the specification, and accordingly, a first component in the specification may be a second component in the claims.

Note that in the following embodiments, the technical features of several different embodiments may be replaced, reorganized, and mixed without departing from the spirit of the disclosure so as to complete other embodiments. The technical features of the embodiments may be mixed and matched arbitrarily as long as they do not violate the spirit of the disclosure or conflict with each other.

The electrical connection or coupling described in this disclosure may refer to direct connection or indirect connection. In the case of direct connection, the endpoints of the components on the two circuits are directly connected or connected to each other by a conductor segment. In the case of indirect connection, between the end points of the components on the two circuits there are switches, diodes, capacitors, inductances, other suitable components, or a combination of the above-mentioned components, but the disclosure is not limited thereto.

In the disclosure, thickness, length, and width may be measured by an optical microscope, and thickness may be measured by a cross-sectional image in an electron microscope, but the disclosure is not limited thereto. Moreover, any two values or directions used for comparison may have certain errors. If a first value is equal to a second value, it implies that there may be an error of about 10% between the first value and the second value. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

The electronic device may include the composite layer circuit structure according to the embodiments of the disclosure. The electronic device of the disclosure may include, but is not limited to, display, antenna (e.g. liquid crystal antenna), lighting, sensing, touch, splicing, other suitable functions, or a combination of the above functions, but the disclosure is not limited thereto. The electronic device includes, but is not limited to, a rollable or flexible electronic device. The electronic device may include, for example, liquid crystal, light emitting diode (LED), quantum dot (QD), fluorescence, phosphor, other suitable materials, or a combination thereof. The light emitting diodes may include, for example, organic light emitting diodes (OLED), micro light emitting diodes (micro-LED, mini-LED), or quantum dot light emitting diodes (QLED, QDLED), but the disclosure is not limited thereto. The following description takes a display device or a splicing device as the electronic device, but the disclosure is not limited thereto. The electronic components may include passive components and active components, such as capacitors, resistors, inductances, diodes, transistors, circuit boards, chips, dies, integrated circuits (IC), a combination of the above components or other suitable electronic components, but the disclosure is not limited thereto. The diodes may include light emitting diodes or photodiodes. The light emitting diodes may include, for example, organic light emitting diodes (OLED), sub-millimeter light emitting diodes (mini LED), micro light emitting diodes (micro LED) or quantum dot light emitting diodes (quantum dot LED), but the disclosure is not limited thereto.

Exemplary embodiments of the disclosure are given below, and the same reference numerals are used in the drawings and description to refer to the same or similar parts.

Figure 2:
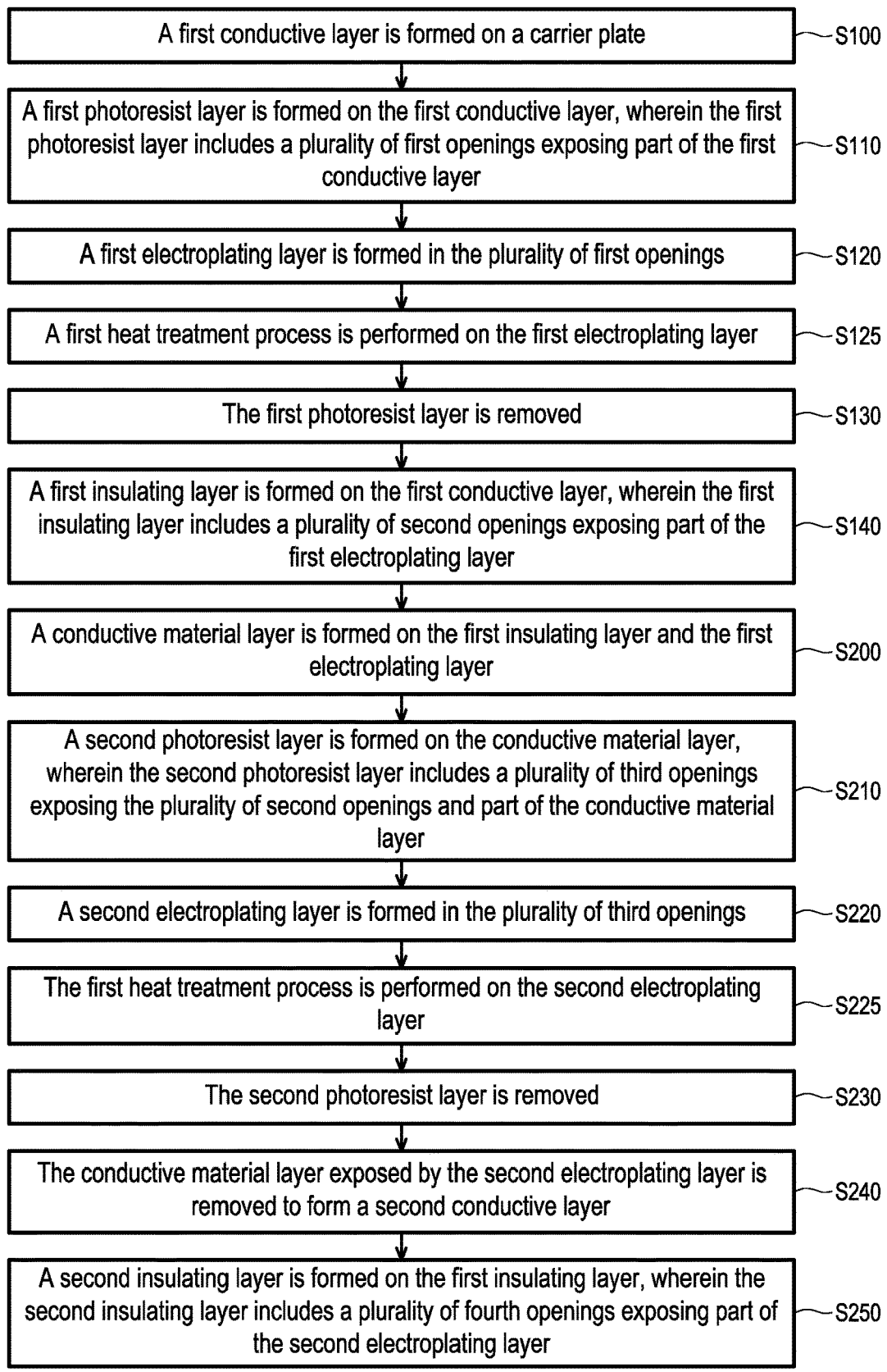
FIG. 2 is a flowchart of a method for manufacturing a composite layer circuit structure according to the first embodiment of the disclosure.
Figure 3:
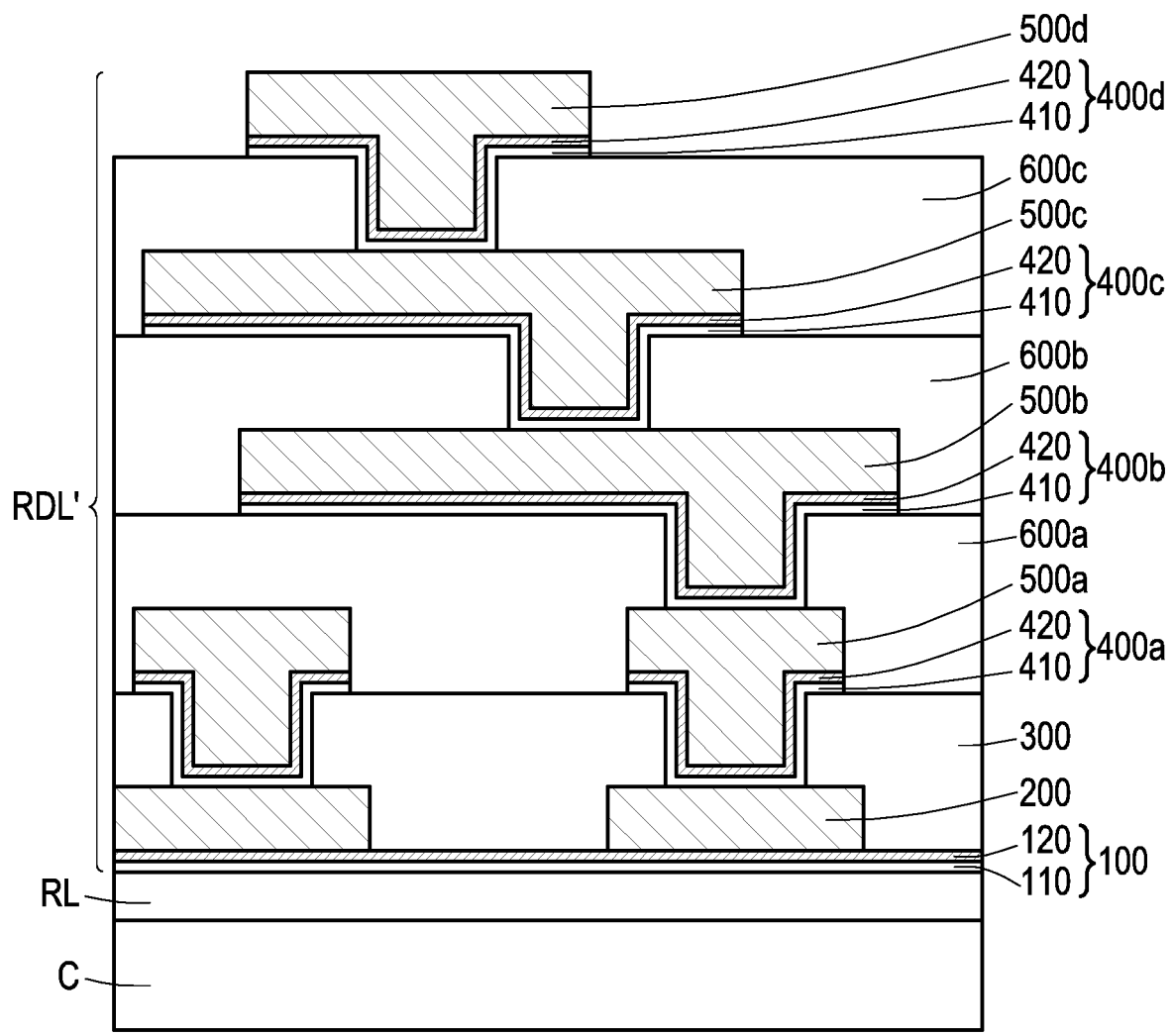
FIG. 3 is a partial cross-sectional schematic diagram of a composite layer circuit structure according to an embodiment of the disclosure.

FIGS. 1A to 1M are partial cross-sectional schematic diagrams of a method for manufacturing a composite layer circuit structure according to a first embodiment, FIG. 2 is a flowchart of a method for manufacturing a composite layer circuit structure according to the first embodiment, and FIG. 3 is a partial cross-sectional schematic diagram of a composite layer circuit structure according to an embodiment of the disclosure. The composite layer circuit structure provided by the embodiment of the disclosure is, for example, configured to achieve a redistribution layer of a high-density integrated circuit (IC), but the disclosure is not limited thereto. A composite layer circuit structure 10 provided by the embodiment of the disclosure may include multiple layers of conductive layers and multiple layers of dielectric layers stacked alternately in the normal direction of a carrier plate CP.

Referring to FIG. 1A to FIG. 1M and FIG. 2 at the same time, in step S100 (FIG. 1A) of this embodiment, a first conductive layer 100 is formed on the carrier plate CP. The material of the carrier plate CP may be, for example, an organic material or an inorganic material, such as glass, quartz, sapphire, silicon wafer, stainless steel, ceramic, molding compound (such as polycarbonate (PC), polyimide (PI), polyethylene terephthalate (polyethylene terephthalate, PET), resin, epoxy resin, organosilicon compound), other suitable substrate materials, or a combination of the above, but the disclosure is not limited thereto. In some embodiments, the carrier plate CP may have a rectangular shape for application in panel level packaging. In this embodiment, before the first conductive layer 100 is formed on the carrier plate CP, a release layer RL may first be formed on the carrier plate CP. The disposition of the release layer RL allows the components subsequently disposed on the carrier plate CP to be easily separated therefrom. The release layer RL may be separated from the carrier plate CP or the components by a laser process or a heating process. For example, the release layer RL has good heat resistance, so as to withstand the subsequent heat treatment process. The material of the release layer RL may be, for example, an appropriate organic material, which is not limited in the disclosure. The method for forming the first conductive layer 100 may be, for example, using a physical vapor deposition process or a chemical vapor deposition process, but the disclosure is not limited thereto. The first conductive layer 100 may be made of metal, for example, and may have a single-layer structure or a composite-layer structure with a plurality of sublayers formed of different metals, for example, wherein the sublayers are stacked on each other. For example, the first conductive layer 100 in this embodiment may include a titanium layer 110 and a copper layer 120 stacked on the titanium layer 110, and has a composite layer structure, but the disclosure is not limited thereto. In this embodiment, the first conductive layer 100 serves as a seed layer.

In step S110 (FIG. 1B) of this embodiment, a first photoresist layer PL1 is formed on the first conductive layer 100, wherein the first photoresist layer PL1 includes a plurality of first openings OP1 exposing part of the first conductive layer 100. The method for forming the first photoresist layer PL1 may be, for example, performing the following steps. First, a first photoresist material layer (not shown) is formed on the first conductive layer 100, wherein the first photoresist material layer may be formed by, for example, a spin coating process or other suitable processes, which is not limited in the disclosure. Next, a patterning process is performed on the first photoresist material layer to form the first photoresist layer PL1 having the plurality of first openings OP1, wherein the first openings OP1 expose part of the first conductive layer 100 under the first photoresist layer PL1.

In step S120 (FIG. 1C) of this embodiment, a first electroplating layer 200 is formed in the plurality of first openings OP1. The method for forming the first electroplating layer 200 may be, for example, formed in the first openings OP1 by an electroplating process by growing from the part of the first conductive layer 100 exposed by the first openings OP1. Accordingly, the material of the first electroplating layer 200 may be, for example, the same as the material of the part of the first conductive layer 100 exposed by the first openings OP1. In this embodiment, the part of the first conductive layer 100 exposed by the first openings OP1 is the copper layer 120. In other words, the material of the first electroplating layer 200 includes copper. In some embodiments, a top surface of the formed first electroplating layer 200 may be lower than a top surface of the first photoresist layer PL1, but the disclosure is not limited thereto.

In step S125 (FIG. 1D) of this embodiment, a first heat treatment process HP1 is performed on the first electroplating layer 200. The method for performing the first heat treatment process HP1 may be, for example, performing a heating and water washing process on the first electroplating layer 200, wherein the temperature when performing the first heat treatment process HP1 is higher than or equal to 40° C. and lower than or equal to 80° C., and the time when performing the first heat treatment process HP1 is less than or equal to 3 hours. Even further, the time when performing the first heat treatment process HP1 may be less than or equal to 1 hour. Since the material (e.g. copper) of the first electroplating layer 200 formed by electroplating process has self-annealing property, the crystal structure of the first electroplating layer 200 changes with time. In detail, the crystal size of the crystal structure of the first electroplating layer 200 will increase with time (from a nanoscale size to a microscale size). Moreover, the crystallographic orientation of the crystal structure of the first electroplating layer 200 will gradually change to the same crystallographic orientation with time, wherein the crystal size of the crystal structure of the first electroplating layer 200 needs at least 20 hours at room temperature to increase to a micrometer size and the rate of increase tends to slow down. Further, the crystallographic orientation of the crystal structure of the first electroplating layer 200 needs at least 128 hours at room temperature before substantially having the crystallographic orientation, wherein the crystallographic orientation referred to in the disclosure may be obtained, for example, by an electron backscatter diffraction (EBSD) or X-ray diffraction analyzer in a scanning electron microscope (SEM). For example, the crystallographic orientation of the second conductive layer 200 at room temperature is (h, k, l)=(1, 1, 1) or (1, 0, 1), wherein the crystallographic orientation may be regarded as a more stable state of a material exists at room temperature. However, the manufacturing process of electronic devices is a continuous process, and subsequent processes generally do not wait until the crystal structure of the first electroplating layer 200 no longer changes, thus the crystal size and crystallographic orientation of the crystal structure of the first electroplating layer 200 also continue to change during subsequent processes. Ultimately, the crystal structure of each region of the first electroplating layer 200 will be different, having different grain sizes or different ratios of crystallographic orientations. As a result, the internal stress of each region of the first electroplating layer 200 will be different, and the circuit structure formed subsequently are prone to warpage. The ratio of crystallographic orientation referred to in the disclosure may be obtained, for example, by an electron backscatter diffraction (EBSD) or X-ray diffraction analyzer in an electron microscope (SEM). For example, the crystallinity of the conductive layer may be analyzed using an X-ray diffraction analyzer.

For the above-mentioned technical problems, in this embodiment, the change time of the crystal structure of the first electroplating layer 200 can be shortened by performing the first heat treatment process HP1 on the first electroplating layer 200. Therefore, the subsequent process can be performed quickly and warpage of the circuit structure formed later can be avoided. In some embodiments, after undergoing the first heat treatment process HP1 for less than or equal to 3 hours, the crystal structure of the first electroplating layer 200 has, for example, a grain size larger than or equal to 0.5 micrometers (μm) and smaller than or equal to 10 micrometers, wherein the grain size tends to be stabilize. In other words, the grain size of the second conductive layer 200 after at least t hours of the first heat treatment process HP1 proposed in this embodiment is $G_t$; the grain size of the second conductive layer 200 after at least t+n hours of the first heat treatment process HP1 proposed in this embodiment is $G_{t+n}$, and the grain size of the second conductive layer 200 after at least t-n hours of the first heat treatment process HP1 proposed in this embodiment is $G_{t-n}$, wherein when $(G_t-G_{t-n})/G_{t-n}$ is larger than $(G_{t+n}-G_t)/G_t$, the change of grain size decreases with time. In other words, the grain size change tends to stabilize, wherein t is larger than n, and t and n are natural numbers. Alternatively, after undergoing the first heat treatment process HP1 for less than or equal to 3 hours, the crystal structure of the first electroplating layer 200 substantially has a crystallographic orientation of (1, 1, 1) or (1, 0, 1). In other words, after undergoing the first heat treatment process HP1 for less than or equal to 3 hours, the crystallinity of the second conductive layer 200 is more than or equal to 20% and less than or equal to 100%. According to some embodiments, the crystallinity of the second conductive layer 200 is more than or equal to 30% and less than or equal to 90%; alternatively, according to some embodiments, the crystallinity of the second conductive layer 200 is more than or equal to 40% and less than or equal to 80%, but the disclosure is not limited thereto. Accordingly, by performing the first heat treatment process HP1 on the first electroplating layer 200, the process efficiency of the method for manufacturing the composite layer circuit structure according to this embodiment or the reliability and/or electrical properties of the composite layer circuit structure manufactured by the method for manufacturing the composite layer circuit structure according to this embodiment can be improved.

In step S130 (FIG. 1E) of this embodiment, the first photoresist layer PL1 is removed. The method for removing the first photoresist layer PL1 may be, for example, performing an ashing process or other suitable stripping processes, and the disclosure is not limited thereto.

In step S140 (FIG. 1F) of this embodiment, a first insulating layer 300 is formed on the first conductive layer 100, wherein the first insulating layer 300 includes a plurality of second openings OP2 exposing part of the first electroplating layer 200. The method for forming the first insulating layer 300 may be, for example, performing the following steps. First, a first insulating material layer (not shown) covering the first electroplating layer 200 is formed on the first conductive layer 100, wherein the first insulating material layer may be formed by, for example, chemical vapor deposition process or other suitable processes, and the disclosure is not limited thereto. Next, a patterning process is performed on the first insulating material layer to form the first insulating layer 300 having the plurality of second openings OP2, wherein the second openings OP2 expose part of the first electroplating layer 200. The material of the first insulating layer 300 may be, for example, oxides, nitrides, phosphosilicate glass, borophosphosilicate glass, organic materials, or a combination thereof, which is not limited in the disclosure.

In some embodiments, after the first insulating layer 300 is formed on the first conductive layer 100, the following steps may further include performing the following steps in order: step S200, step S210, step S220, step S225, step S230, step S240, and step S250.

In the step S200 (FIG. 1G) of this embodiment, a conductive material layer 400M is formed on the first insulating layer 300 and the first electroplating layer 200. The method for forming the conductive material layer 400M may be, for example, using a physical vapor deposition process or a chemical vapor deposition process, but the disclosure is not limited thereto. The conductive material layer 400M in this embodiment may also include a titanium layer 410a, and a copper layer 420a stacked on the titanium layer 410a, and has a composite layer structure, but the disclosure is not limited thereto. In this embodiment, the conductive material layer 400M serves as a seed layer.

In the step S210 (FIG. 1H) of this embodiment, a second photoresist layer PL2 is formed on the conductive material layer 400M, wherein the second photoresist layer PL2 includes a plurality of third openings OP3 exposing the plurality of second openings OP2 and part of the conductive material layer 400M. The method for forming the second photoresist layer PL2 may be, for example, performing the following steps. First, a second photoresist material layer (not shown) is formed on the conductive material layer 400M, wherein the second photoresist material layer may be formed by, for example, a spin coating process or other suitable processes, and the disclosure is not limited thereto. Next, a patterning process is performed on the second photoresist material layer to form the second photoresist layer PL2 having the plurality of third openings OP3, wherein the third openings OP3, for example, expose the plurality of second openings OP2 and part of the conductive material layer 400M under the second photoresist layer PL2.

In the step S220 (FIG. 1I) of this embodiment, a second electroplating layer 500 is formed in the plurality of third openings OP3. The method for forming second electroplating layer 500 may be, for example, formed in the third openings OP3 by an electroplating method by growing from the part of the conductive material layer 400M exposed by the third openings OP3, wherein the second electroplating layer 500, for example, fills the second openings OP2 exposed by the third openings OP3, such that the second electroplating layer 500 may be electrically connected to the first electroplating layer 200, for example, through the conductive material layer 400M. Accordingly, the material of the second electroplating layer 500 may be, for example, the same as the material of the part of the conductive material layer 400M exposed by the third openings OP3. In other words, the material of the second electroplating layer 500 includes copper. In some embodiments, a top surface of the formed second electroplating layer 500 may be lower than a top surface of the second photoresist layer PL2, but the disclosure is not limited thereto.

In the step S225 (FIG. 1J) of this embodiment, the first heat treatment process HP1 is performed on the second electroplating layer 500, wherein the process parameters and the effects brought forth by the first heat treatment process HP1 may be referred to the step S125 described in the above, which will not be repeated here.

In the step S230 (FIG. 1K) of this embodiment, the second photoresist layer PL2 is removed. The method for removing the second photoresist layer PL2 may be, for example, performing an ashing process or other suitable stripping processes, and the disclosure is not limited thereto.

In the step S240 (FIG. 1L) of this embodiment, after removing the second photoresist layer PL2, the conductive material layer 400M exposed by the second electroplating layer 500 is removed to form a second conductive layer 400, wherein the second conductive layer 400 includes a titanium layer 410, and a copper layer 420 stacked on the titanium layer 410. The method for removing the conductive material layer 400M exposed by the second electroplating layer 500 may be, for example, performing an etching process, but the disclosure is not limited thereto. As previously mentioned, since the material (copper) of the conductive material layer 400M formed by the electroplating process has self-annealing property, the crystal structure of the conductive material layer 400M also changes with time. In the case where the first heat treatment process HP1 is not performed, because the crystal size of the conductive material layer 400M is small at this time (such as the above-mentioned nanoscale size), the second conductive layer 400 is prone to pinhole defects after undergoing the etching process. Accordingly, in this embodiment, by performing the first heat treatment process HP1 on the second electroplating layer 500 before removing the conductive material layer 400M exposed by the second electroplating layer 500, the change time of the crystal structure of the conductive material layer 400M located under the second electroplating layer 500 can also be shortened, such that the conductive material layer 400M after undergoing the heating process has a relatively large crystal size (such as the above-mentioned microscale size) during the etching process, thereby avoiding pinhole defects.

In the step S250 (FIG. 1M) of this embodiment, a second insulating layer 600 is formed on the first insulating layer 300, wherein the second insulating layer 600 includes a plurality of fourth openings OP4 exposing part of the second electroplating layer 500. The method for forming the second insulating layer 600 may be, for example, performing the following steps. First, a second insulating material layer (not shown) covering the second electroplating layer 500 is formed on the first insulating layer 300, wherein the second insulating material layer may be formed by, for example, a chemical vapor deposition process or other suitable processes, but the disclosure is not limited thereto. Next, a patterning process is performed on the second insulating material layer to form the second insulating layer 600 having the plurality of fourth openings OP4, wherein the fourth openings OP4 expose part of the second electroplating layer 500. The material of the second insulating layer 600 may be, for example, similar to or the same as the material of the first insulating layer 300, and thus will not be repeated here.

Note here that in this embodiment, the first conductive layer 100, the first electroplating layer 200, the first insulating layer 300, the second conductive layer 400, the second electroplating layer 500, and the second insulating layer 600 may define a redistribution structure RDL, but the disclosure is not limited thereto. In other words, multiple cycles of step S200, step S210, step S220, step S225, step S230 and step S240 in this embodiment may be repeated to define a composite layer circuit structure 20 shown in FIG. 3, wherein the composite layer circuit structure 20 includes a redistribution structure RDL' having a multi-layered second conductive layer 400 (a second conductive layer 400a, a second conductive layer 400b, a second conductive layer 400c, and a second conductive layer 400d), a multi-layered second electroplating layer 500 (a second electroplating layer 500a, a second electroplating layer 500b, a second electroplating layer 500c, and a second electroplating layer 500d), and a multi-layered second insulating layer 600 (a second insulating layer 600a, a second insulating layer 600b, and a second insulating layer 600c).

Thus, the manufacturing of the composite layer circuit structure 10 according to this embodiment of the disclosure is completed. Note that although the method for manufacturing the composite layer circuit structure in this embodiment is described by taking the above-mentioned method as an example, the method for forming the composite layer circuit structure in the disclosure is not limited thereto. Further, although the composite layer circuit structure 10 according to this embodiment of the disclosure takes an application to panel level packaging as an example, the composite layer circuit structure of the disclosure may be applied to a variety of semiconductor devices and/or semiconductor manufacturing processes, and the disclosure is not limited thereto.

Figure 4:
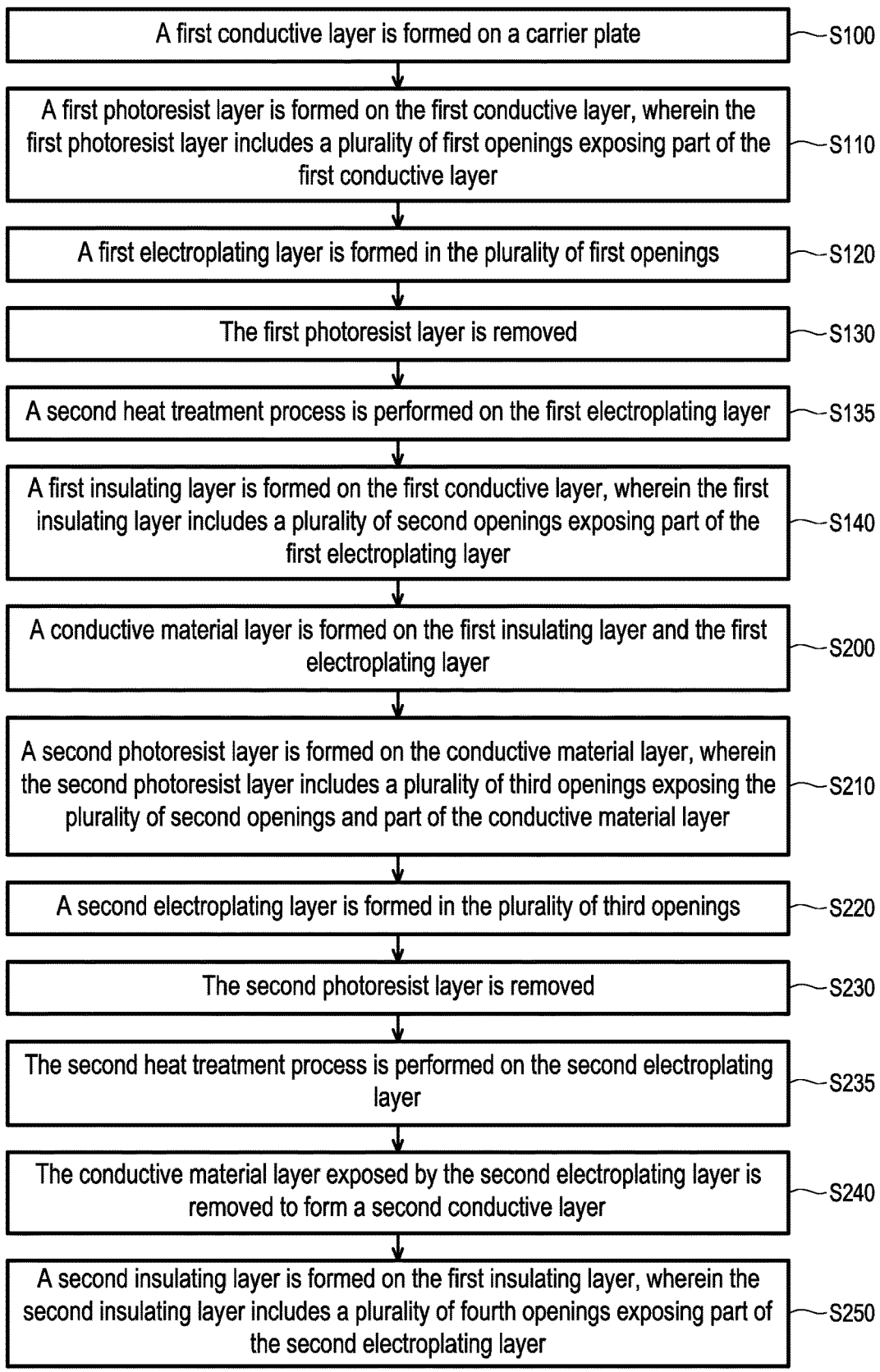
FIG. 4 is a flowchart of a method for manufacturing a composite layer circuit structure according to a second embodiment.

FIG. 4 is a flowchart of a method for manufacturing a composite layer circuit structure according to a second embodiment. Note that the embodiment of FIG. 4 may use the structural symbols and part of the content of the embodiment of FIG. 2, wherein the same or similar symbols are used to represent the same or similar structures, and the description of the same technical content is omitted.

Referring to FIGS. 1A to 1M and FIG. 4 at the same time, the main difference between the method for manufacturing the composite layer circuit structure according to this embodiment and the above-mentioned method for manufacturing the composite layer circuit structure 10 is: 1) this embodiment does not include the step S125 of performing the first heat treatment process HP1 on the first electroplating layer 200 and the step S225 of performing the first heat treatment process HP1 on the second electroplating layer 500; 2) this embodiment further includes a step S135 of performing a second heat treatment process HP2 on the first electroplating layer 200, which is performed after the step S130 of removing the first photoresist layer PL1; and 3) this embodiment further includes a step S235 of performing the second heat treatment process HP2 on the second electroplating layer 500, which is performed after the step S230 of removing the second photoresist layer PL2. In the step S135 of this embodiment, the method for performing the second heat treatment process HP2 may be, for example, placing the first electroplating layer 200 in an oven to for a heating process in an atmosphere of an inert gas, wherein the temperature when performing the second heat treatment process HP2 is higher than or equal to 40° C. and lower than or equal to 300° C., and the time when performing the second heat treatment process HP2 is less than or equal to 3 hours. Further, the time when performing the second heat treatment process HP1 may be less than or equal to 1 hour, and the inert gas used includes nitrogen. Performing the second heat treatment process HP2 on the first electroplating layer 200 in an atmosphere of inert gas can prevent oxidation of the material (copper) of the second electroplating layer 500 and/or the second conductive layer 400. Moreover, making the temperature of the second heat treatment process HP2 lower than or equal to 300° C. can also prevent oxidation of the material (copper) of the second electroplating layer 500 and/or the second conductive layer 400. Similarly, by performing the second heat treatment process HP2 on the first electroplating layer 200 can shorten the time change of the crystal structure of the first electroplating layer 200. Therefore, the subsequent process can be performed quickly and warpage of the subsequent formation of the circuit structure can be prevented. In some embodiments, after undergoing the second heat treatment process HP2 for less than or equal to 3 hours, the crystal structure of the first electroplating layer 200 has a crystal size larger than or equal to 0.5 micrometer (μm) and smaller than or equal to 10 microns, and the grain size tends to be stable. Also, after undergoing the second heat treatment process HP2 for less than or equal to 3 hours, the crystal structure of the first electroplating layer 200 substantially has a crystallographic orientation of (1, 1, 1).

Accordingly, by performing the second heat treatment process HP2 on the first electroplating layer 200, the process efficiency of the method for manufacturing the composite layer circuit structure according to this embodiment or the reliability and/or electrical properties of the circuit structure manufactured by the method for manufacturing the composite layer circuit structure according to this embodiment can be improved. Moreover, in the step S235 of this embodiment, the second heat treatment process HP2 is also performed on the second electroplating layer 500, and in this embodiment, by performing the second heat treatment process HP2 on the second electroplating layer 500 before removing the conductive material layer 400M exposed by the second electroplating layer 500, as previously mentioned. In this embodiment, the conductive material layer 400M can have a relatively large crystal size during the etching process, thereby avoiding pinhole defects, wherein for the process parameters and other effects when the second heat treatment process HP2 is performed, reference may be made to the step S135 in the above, and details are not repeated herein.

Figure 5:
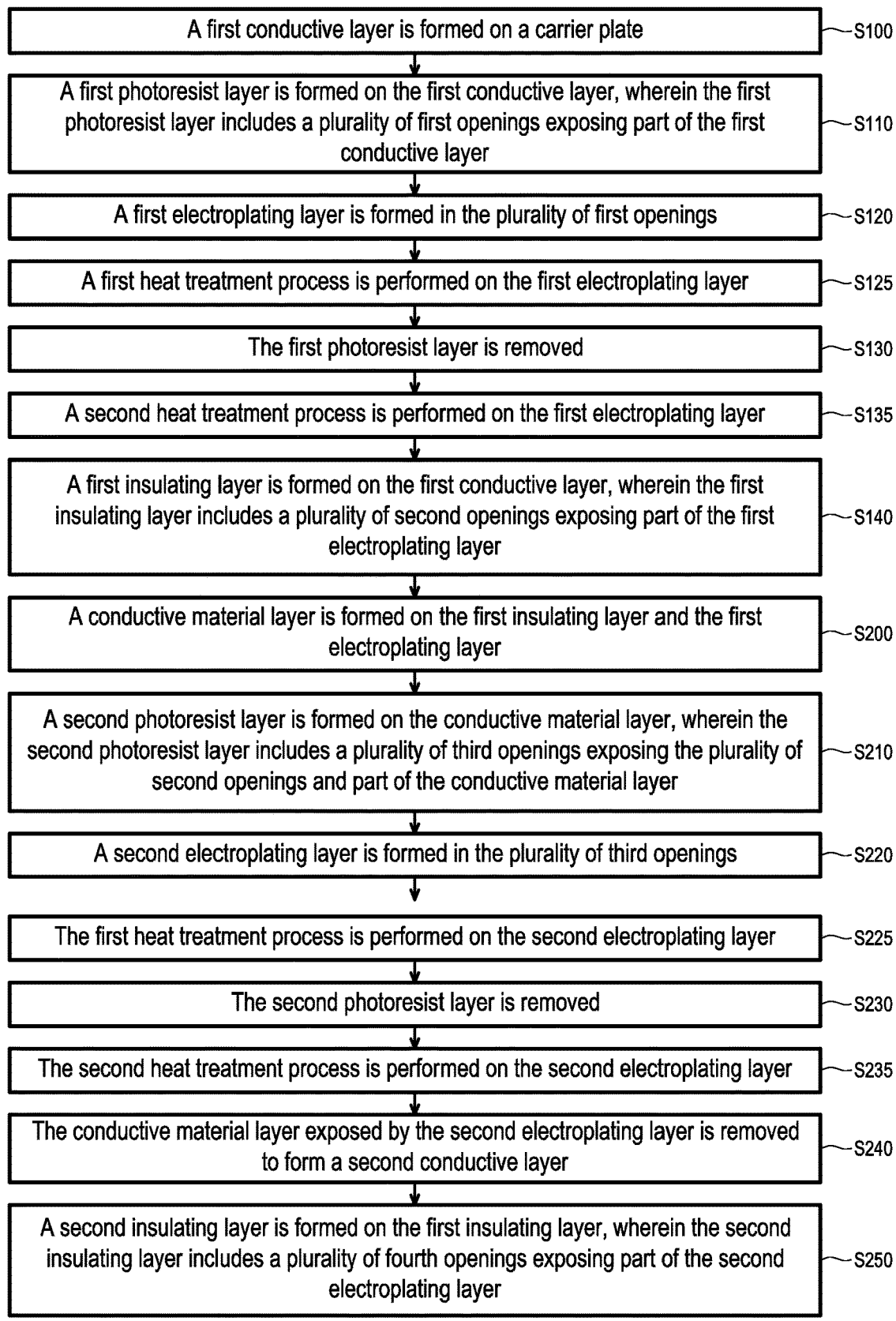
FIG. 5 is a flowchart of a method for manufacturing a composite layer circuit structure according to a third embodiment.

FIG. 5 is a flowchart of a method for manufacturing a composite layer circuit structure according to a third embodiment. Note that the embodiment of FIG. 5 may use the structural symbols and part of the content of the embodiment of FIG. 2, wherein the same or similar symbols are used to represent the same or similar structures, and the description of the same technical content is omitted.

Referring to FIGS. 1A to 1M and FIG. 5 at the same time, the main difference between the method for manufacturing the composite layer circuit structure according to this embodiment and the above-mentioned method for manufacturing the composite layer circuit structure 10 is: 1) this embodiment further includes the step S135 of performing the second heat treatment process HP2 on the first electroplating layer 200, which is performed after the step S130 of removing the first photoresist layer PL1; and 2) this embodiment further includes the step S235 of performing the second heat treatment process HP2 on the second electroplating layer 500, which is performed after the step S230 of removing the second photoresist layer PL2.

In this embodiment, the method for performing the second heat treatment process HP2 may be, for example, placing the first electroplating layer 200 for a heating process in an atmosphere of an inert gas, wherein the temperature when performing the second heat treatment process HP2 is higher than or equal to 40° C. and lower than or equal to 300° C., the time when performing the second heat treatment process HP2 is less than or equal to 3 hours, and the inert gas used includes nitrogen. Similarly, by performing the second heat treatment process HP2 on the first electroplating layer 200, the change time of the crystal structure of the first electroplating layer 200 can be shortened. Therefore, the subsequent process can be performed quickly and warpage of the subsequent formation of the circuit structure can be avoided.

In some embodiments, after undergoing the first heat treatment process HP1 and the second heat treatment process HP2 for a total of less than or equal to 6 hours, or even further, after undergoing the first heat treatment process HP1 and the second heat treatment process HP2 for a total of less than or equal to 3 hours, the crystal structure of the first electroplating layer 200 has a crystal size, for example, larger than or equal to 0.5 micrometers ($\mu m$) and smaller than or equal to 10 micrometers, and the crystal grain size tends to be stabilize. Further, after undergoing the first heat treatment process HP1 and the second heat treatment process HP2 for a total of less than or equal to 3 hours, the crystallographic orientation of the crystal structure of the first electroplating layer 200 substantially has a crystallographic orientation of (111). Accordingly, performing the first heat treatment process HP1 and the second heat treatment process HP2 on the first electroplating layer 200 can improve the process efficiency of the method for manufacturing the composite layer circuit structure according to this embodiment or the reliability and/or electrical properties of the circuit structure manufactured by the method for manufacturing the composite layer circuit structure according to this embodiment. In other words, by performing the first heat treatment process HP1 or the second heat treatment process HP2 on the electroplating layer as proposed by the disclosure, the time needed for the crystallographic orientation of the electroplating layer stabilize, thereby improving the production efficiency. Further, in the step S235 of this embodiment, the second heat treatment process HP2 is also performed on the second electroplating layer 500, and in this embodiment, by performing the first heat treatment process HP1 and the second heat treatment process HP2 on the second electroplating layer 500 before removing the conductive material layer 400M exposed by the second electroplating layer 500, as previously mentioned. In this embodiment, the conductive material layer 400M can have a relatively large crystal size during the etching process, thereby avoiding the generation of pinhole defects, wherein, for the process parameters and other effects when the second heat treatment process HP2 is performed, reference may be made to the step S135 in the above, and details are not described herein again.

Note here that although it is recited in the above-mentioned embodiments of the disclosure that the first heat treatment process HP1 and/or the second heat treatment process HP2 are performed on both the first electroplating layer 200 and the second electroplating layer 500, the disclosure is not limited thereto. In other words, in other embodiments, the method for manufacturing the composite layer circuit structure of the disclosure may also include performing the first heat treatment process HP1 on the first electroplating layer 200, and performing the second heat treatment process HP2 on the second electroplating layer 500, or performing the second heat treatment process HP2 on the first electroplating layer 200, and performing the first heat treatment process HP1 on the second electroplating layer 500.

According, according to the embodiment of the disclosure, by performing at least one heat treatment process on the first electroplating layer before forming the first insulating layer, the change time of the crystal structure of the first electroplating layer can be shortened. Similarly, by performing at least one heat treatment process on the second electroplating layer before removing the conductive material layer exposed by the second electroplating layer, the change time of the crystal structure of the second electroplating layer can also be shortened. Therefore, the subsequent processes can be performed quickly and warpage of the subsequently formed circuit structure can be avoided. Furthermore, when at least one heat treatment process is performed on the second electroplating layer, the conductive material layer located under the second electroplating layer also undergoes the heat treatment process. Therefore, by performing at least one heat treatment process on the second electroplating layer before removing the conductive material layer exposed by the second electroplating layer, the conductive material layer undergone the at least one heat treatment process can have a relatively large crystal size during the etching process, thereby avoiding pinhole defects. Accordingly, performing at least one heat treatment process on the first electroplating layer and the second electroplating layer can improve the process efficiency of the method for manufacturing the composite layer circuit structure according to this embodiment of the disclosure or the reliability and/or electrical properties of the composite layer circuit structure manufactured by the method for manufacturing the composite layer circuit structure according to this embodiment of the disclosure.

Figure 6:
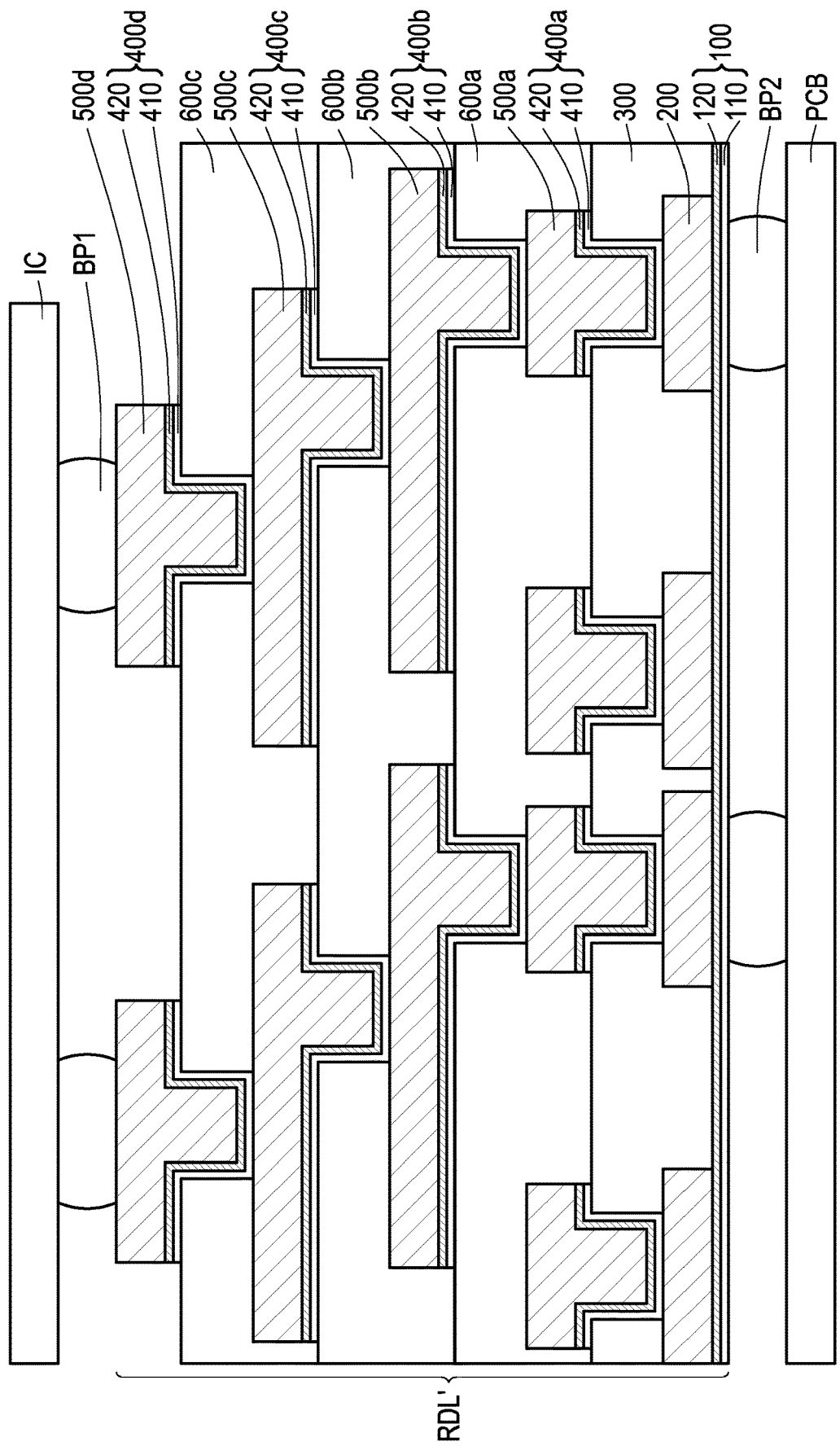
FIG. 6 is a partial cross-sectional schematic diagram of a composite layer circuit structure applied to a semiconductor package type electronic device according to an embodiment of the disclosure.

FIG. 6 is a partial cross-sectional schematic diagram of a composite layer circuit structure applied to a semiconductor package type electronic device according to an embodiment of the disclosure. Note that the embodiment of FIG. 6 may use the structural symbols and part of the content of the embodiment of FIG. 3, wherein the same or similar symbols are used to represent the same or similar structures, and the description of the same technical content is omitted.

Referring to FIG. 6, in some embodiments, the method for manufacturing the composite layer circuit structure of the disclosure (herein, the composite layer circuit structure 20 is taken as an example, but the disclosure is not limited thereto) may be applied to, for example, manufacturing of a semiconductor package type electronic device 1, such as a system on chip (SoC), system in package (SiP), or other electronic devices manufactured by the above-mentioned methods. To be specific, the method for manufacturing the composite layer circuit structure 20 according to an embodiment of the disclosure may be applied to a redistribution layer first (RDL first) manufacturing method, a chip first/face up manufacturing method, or a chip first/face down manufacturing method. When the composite layer circuit structure 20 of an embodiment of the disclosure is applied to the redistribution layer first manufacturing method, the carrier plate CP may include glass, quartz, sapphire, ceramic, stainless steel, silicon wafer, molding compound (e.g. resin, epoxy resin, organosilicon compound), other suitable substrate materials, or a combination of the above, but the disclosure is not limited thereto. When the composite layer circuit structure 20 of an embodiment of the disclosure is applied to the die-first/face-up manufacturing method and the die-first/face-down manufacturing method, the carrier plate CP may include glass, integrated circuit chip molded by molding compound (e.g. resin, epoxy resin, organosilicon compound), silicon wafer, other suitable substrate materials, or a combination of the above, but the disclosure is not limited thereto. In some embodiments, when the composite layer circuit structure 20 according to an embodiment of the disclosure is applied to the redistribution layer first manufacturing method, the carrier plate CP may be removed after the composite layer circuit structure 20 is manufactured, such that the redistribution structure RDL' included in the composite layer circuit structure 20 may be bonded with components such as the integrated circuit chip IC shown in FIG. 6 and/or a printed circuit board PCB in the subsequent process, but the disclosure is not limited thereto. In some embodiments, when the composite layer circuit structure 20 according to an embodiment of the disclosure is applied to the die-first/face-up manufacturing method and the die-first/face-down manufacturing method, a release layer may be optionally provided on the carrier board CP or no release layer is required, such that the redistribution structure RD' included in the composite layer circuit structure 20 may be bonded with components such as a printed circuit board in the subsequent process, but the disclosure is not limited thereto. The bonding may be performed by arranging bonding pads between the redistribution structure RDL' and the electronic components, as shown in FIG. 6, wherein a bonding pad BP1 is provided between the redistribution structure RDL' and the integrated circuit chip IC, and a bonding pad BP2 is provided between the redistribution structure RDL' and the printed circuit board PCB, but the disclosure is not limited thereto.

Finally, it should be noted that the above embodiments are used only to illustrate the technical solution of the disclosure, but not to limit the same. Although the disclosure is described in detail with reference to the above embodiments, those skilled in the art should understand that: the technical solutions described in the above embodiments may still be modified, and some or all of the technical features may be replaced equivalently; such modifications or replacements do not depart from the scope of the technical solutions described by the embodiments of the disclosure. The features of each embodiment can be mixed and matched arbitrarily as long as they do not violate the spirit of the disclosure or conflict with each other.

What is claimed is:

1. A method for manufacturing a composite layer circuit structure of an electronic device, the method comprising:
    forming a first conductive layer on a carrier plate;
    forming a first photoresist layer on the first conductive layer, wherein the first photoresist layer comprises a plurality of first openings exposing part of the first conductive layer;
    forming a first electroplating layer in the plurality of first openings;
    removing the first photoresist layer; and
    forming a first insulating layer on the first conductive layer, wherein the first insulating layer comprises a plurality of second openings exposing part of the first electroplating layer,
    wherein at least one heat treatment process is performed on the first electroplating layer before the first insulating layer is formed on the first conductive layer,
    wherein, a temperature when performing the at least one heat treatment process is higher than or equal to 40° C. and lower than or equal to 300° C., and a time when performing the at least one heat treatment process is less than or equal to 3 hours,
    wherein a step of performing the at least one heat treatment process on the first electroplating layer comprises: performing a first heat treatment process on the first electroplating layer before removing the first photoresist layer, wherein a temperature when performing the first heat treatment process is higher than or equal to 40° C. and lower than or equal to 80° C., and a time when performing the first heat treatment process is less than or equal to 3 hours.

2. The method for manufacturing a composite layer circuit structure of an electronic device according to claim 1, wherein the time when performing the first heat treatment process is less than or equal to 1 hour.

3. The method for manufacturing a composite layer circuit structure of an electronic device according to claim 1, wherein after the first heat treatment process is performed on the first electroplating layer, a crystal structure of the first electroplating layer has a grain size larger than or equal to 0.5 micrometers and smaller than or equal to 10 micrometers.

4. The method for manufacturing a composite layer circuit structure of an electronic device according to claim 1, wherein the step of performing the at least one heat treatment process on the first electroplating layer further comprises: performing a second heat treatment process on the first electroplating layer after removing the first photoresist layer, wherein a temperature when performing the second heat treatment process is higher than or equal to 40° C. and lower than or equal to 300° C.; and performing the second heat treatment process in an atmosphere of an inert gas, wherein a time when performing the second heat treatment process is less than or equal to 3 hours.

5. The method for manufacturing a composite layer circuit structure of an electronic device according to claim 4, wherein the time when performing the first heat treatment process and the second heat treatment process is less than or equal to 3 hours in total.

6. The method for manufacturing a composite layer circuit structure of an electronic device according to claim 4, wherein the inert gas comprises nitrogen.

7. The method for manufacturing a composite layer circuit structure of an electronic device according to claim 5, wherein the time when performing the second heat treatment process is less than or equal to 1 hour.

8. The method for manufacturing a composite layer circuit structure of an electronic device according to claim 5, wherein after the second heat treatment process is performed on the first electroplating layer, a crystal structure of the first electroplating layer has a grain size larger than or equal to 0.5 micrometers and smaller than or equal to 10 micrometers.

9. The method for manufacturing a composite layer circuit structure of an electronic device according to claim 1, wherein after the first insulating layer is formed on the first conductive layer, the method further comprises following steps:
   forming a conductive material layer on the first insulating layer and the first electroplating layer;
   forming a second photoresist layer on the conductive material layer, wherein the second photoresist layer comprises a plurality of third openings exposing the plurality of second openings and part of the conductive material layer;
   forming a second electroplating layer in the plurality of third openings, wherein the second electroplating layer is electrically connected to the first electroplating layer;
   removing the second photoresist layer;
   removing the conductive material layer exposed by the second electroplating layer to form a second conductive layer; and
   forming a second insulating layer on the first insulating layer, wherein the second insulating layer comprises a plurality of fourth openings exposing part of the second electroplating layer,
   wherein the at least one heat treatment process is performed on the second electroplating layer before removing the conductive material layer exposed by the second electroplating layer.

10. The method for manufacturing a composite layer circuit structure of an electronic device according to claim 9, wherein the first conductive layer, the first electroplating layer, the first insulating layer, the second conductive layer, the second electroplating layer, and the second insulating layer define a redistribution structure.

11. The method for manufacturing a composite layer circuit structure of an electronic device according to claim 10, wherein the step of performing the at least one heat treatment process on the second electroplating layer comprises: performing the first heat treatment process on the second electroplating layer before removing the second photoresist layer.

12. The method for manufacturing a composite layer circuit structure of an electronic device according to claim 11, wherein the time for performing the first heat treatment process is less than or equal to 1 hour.

13. The method for manufacturing a composite layer circuit structure of an electronic device according to claim 11, wherein after the first heat treatment process is performed on the second electroplating layer, a crystal structure of the second electroplating layer has a grain size larger than or equal to 0.5 micrometers and smaller than or equal to 10 micrometers.

14. The method for manufacturing a composite layer circuit structure of an electronic device according to claim 9, wherein the step of performing the at least one heat treatment process on the second electroplating layer comprises: performing a second heat treatment process on the second electroplating layer after removing the second photoresist layer, wherein a temperature when performing the second heat treatment process is higher than or equal to 40° C. and lower than or equal to 300° C., a time when performing the second heat treatment process is less than or equal to 3 hours, and the second heat treatment process is performed in an atmosphere of an inert gas.

15. The method for manufacturing a composite layer circuit structure of an electronic device according to claim 14, wherein the inert gas comprises nitrogen.

16. The method for manufacturing a composite layer circuit structure of an electronic device according to claim 14, wherein the time for performing the second heat treatment process is less than or equal to 1 hour.

17. The method for manufacturing a composite layer circuit structure of an electronic device according to claim 14, wherein after the second heat treatment process is performed on the second electroplating layer, a crystal structure of the second electroplating layer has a grain size larger than or equal to 0.5 micrometers and smaller than or equal to 10 micrometers.

18. The method for manufacturing a composite layer circuit structure of an electronic device according to claim 1, wherein a release layer is formed on the carrier plate before the first conductive layer is formed on the carrier plate.

* * * * *